United States Patent
Minvielle et al.

(10) Patent No.: US 7,384,725 B2
(45) Date of Patent: Jun. 10, 2008

(54) SYSTEM AND METHOD FOR FABRICATING CONTACT HOLES

(75) Inventors: Anna M. Minvielle, San Jose, CA (US); Cyrus E. Tabery, Santa Clara, CA (US); Hung-eil Kim, San Jose, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 575 days.

(21) Appl. No.: 10/817,193

(22) Filed: Apr. 2, 2004

(65) Prior Publication Data

US 2005/0221233 A1 Oct. 6, 2005

(51) Int. Cl.
 *G03F 7/20* (2006.01)
 *G03F 1/00* (2006.01)
(52) U.S. Cl. .......................................... 430/311; 430/5
(58) Field of Classification Search ............. 430/5, 430/311
 See application file for complete search history.

(56) References Cited

U.S. PATENT DOCUMENTS

| | | | |
|---|---|---|---|
| 5,815,247 A | 9/1998 | Poschenrieder et al. | 355/71 |
| 5,821,034 A | 10/1998 | Kim et al. | |
| 6,261,727 B1 * | 7/2001 | Wang | 430/5 |
| 6,553,562 B2 | 4/2003 | Capodieci et al. | 716/19 |
| 6,589,713 B1 | 7/2003 | Okoroanyanwu | 430/313 |
| 2002/0152452 A1 * | 10/2002 | Socha | 716/21 |
| 2002/0177054 A1 | 11/2002 | Saitoh et al. | |
| 2003/0207521 A1 * | 11/2003 | Tanaka et al. | 438/200 |
| 2004/0057036 A1 * | 3/2004 | Kawashima et al. | 355/77 |
| 2004/0229135 A1 * | 11/2004 | Wang et al. | 430/5 |

FOREIGN PATENT DOCUMENTS

| | | |
|---|---|---|
| EP | 0 794 462 | 9/1997 |
| JP | 8-203807 | 12/1996 |

OTHER PUBLICATIONS

International Search Report and Written Opinion for International Application No. PCT/US2005/007302 filed on Jul. 3, 2005.

* cited by examiner

*Primary Examiner*—Mark F. Huff
*Assistant Examiner*—Brittany Raymond
(74) *Attorney, Agent, or Firm*—Renner, Otto, Boisselle & Sklar, LLP

(57) ABSTRACT

A method of forming a plurality of contact holes of varying pitch and density in a contact layer of an integrated circuit device is provided. The plurality of contact holes can include a plurality of regularly spaced contact holes having a first pitch along a first direction and a plurality of semi-isolated contact holes having a second pitch along a second direction. A double-dipole illumination source can transmit light energy through a mask having a pattern corresponding to a desired contact hole pattern. The double-dipole illumination source can include a first dipole aperture, which is oriented and optimized for patterning the regularly spaced contact holes, and a second dipole aperture, which is oriented substantially orthogonal to the first dipole aperture and optimized for patterning the plurality of semi-isolated contact holes. The contact layer can be etched using the patterned photoresist layer.

14 Claims, 4 Drawing Sheets

SYSTEM AND METHOD FOR FABRICATING CONTACT HOLES

TECHNICAL FIELD

The present invention relates generally to the field of integrated circuit manufacture and, more particularly, to a system and method using customized double-dipole illumination for fabricating contact holes of varying pitch and density.

BACKGROUND

Optical lithography or photolithography has been widely used in the semiconductor industry in connection with the formation of a wide range of structures present in integrated circuit (IC) devices. The photolithography process generally begins with the formation of a photoresist layer on or over the top surface of a semiconductor substrate or wafer (or some intermediate layer). A reticle or mask having fully light non-transmissive opaque regions, which are often formed of chrome, and fully light transmissive clear regions, which are often formed of quartz, is then positioned over the photoresist coated wafer.

The mask is placed between a radiation or light source which produces light of a pre-selected wavelength (e.g., ultraviolet light) and geometry, and an optical lens system, which may form part of a stepper apparatus. When the light from the light source is directed onto the mask, the light is focused to generate a reduced mask image on the wafer, typically using the optical lens system, which contains one or several lenses, filters, and/or mirrors. The light passes through the clear regions of the mask to expose the underlying photoresist layer and is blocked by the opaque regions of the mask, leaving that underlying portion of the photoresist layer unexposed. The exposed photoresist layer is then developed, typically through chemical removal of the exposed or unexposed regions of the photoresist layer. The end result is a semiconductor wafer coated with a photoresist layer exhibiting a desired pattern, which defines geometries, features, lines and shapes of that layer. This pattern can then be used for etching underlying regions of the wafer.

There is a pervasive trend in the art of IC device design and fabrication to increase the density with which various structures are arranged. For example, a flash memory device can include a core region containing one or more arrays of densely-packed double-bit memory cells. The manufacture of such a device can include patterning a contact layer to include regular arrays of densely-packed contact holes (e.g., source/drain contact holes) on a minimum pitch along a first direction as well as a plurality of semi-isolated contact holes (e.g., $V_{ss}$ contact holes). Once formed, these contact holes can be filled with a conductive material, such as a metal, a metal-containing compound or a semiconductor, to form conductive vias for electrically connecting structures disposed above and below the contact layer.

One conventional method of forming contact holes includes performing a double exposure technique using two different illumination sources to expose two different masks (or one mask rotated into two different orientations) for patterning one contact layer. With such a technique, each mask/illumination pair can be optimized to deliver maximum resolution for a given class of structures, while minimizing the impact on the structures defined or otherwise patterned by the other exposure. However, as with any double exposure technique, the effects of misalignment must be taken into account, which can be difficult, time-consuming, and expensive. Otherwise, printing defects may occur.

While various mask types and aggressive illumination strategies have been employed for the imaging of sub-resolution features, including contact holes, each illumination type has certain tradeoffs (e.g., improved contrast at the expense of depth of focus). In addition, each mask type can exhibit varying performance dependent on the pattern to be imaged.

Accordingly, a need exists for an improved system and method for fabricating contact holes of varying pitch and density.

SUMMARY OF THE INVENTION

According to one aspect of the invention, the invention is directed to a method of forming a plurality of contact holes in a contact layer of an integrated circuit device. The plurality of contact holes can include a plurality of regularly spaced contact holes having a first pitch along a first direction and a plurality of semi-isolated contact holes having a second pitch along a second direction. The method can include providing a photoresist layer over the contact layer and exposing the photoresist layer to a double-dipole illumination source. The double-dipole illumination source can transmit light energy through a mask having a pattern corresponding to a desired contact hole pattern. This exposure can result in the desired contact hole pattern being transferred to the photoresist layer. The double-dipole illumination source can include a first dipole aperture, which is oriented and optimized for patterning the regularly spaced contact holes, and a second dipole aperture, which is oriented substantially orthogonal to the first dipole aperture and optimized for patterning the plurality of semi-isolated contact holes. The contact layer can be etched using the patterned photoresist layer.

According to another aspect of the invention, the invention is directed to an aperture plate for use with an illumination source for patterning a plurality of contact holes of varying pitch and density. The plurality of contact holes can include a plurality of regularly spaced contact holes having a first pitch along a first direction and a plurality of semi-isolated contact holes having a second pitch along a second direction. The aperture plate can include a substrate, which defines (i) a first dipole pair of openings customized for patterning the plurality of regularly spaced contact hole openings and (ii) a second dipole pair of openings customized for patterning the plurality of semi-isolated contact hole openings.

These and other features of the invention are fully described and particularly pointed out in the claims. The following description and annexed drawings set forth in detail certain illustrative embodiments of the invention, these embodiments being indicative of but a few of the various ways in which the principles of the invention may be employed.

BRIEF DESCRIPTION OF DRAWINGS

These and further features of the present invention will be apparent with reference to the following description and drawings, wherein.

DISCLOSURE OF INVENTION

Figure 1:
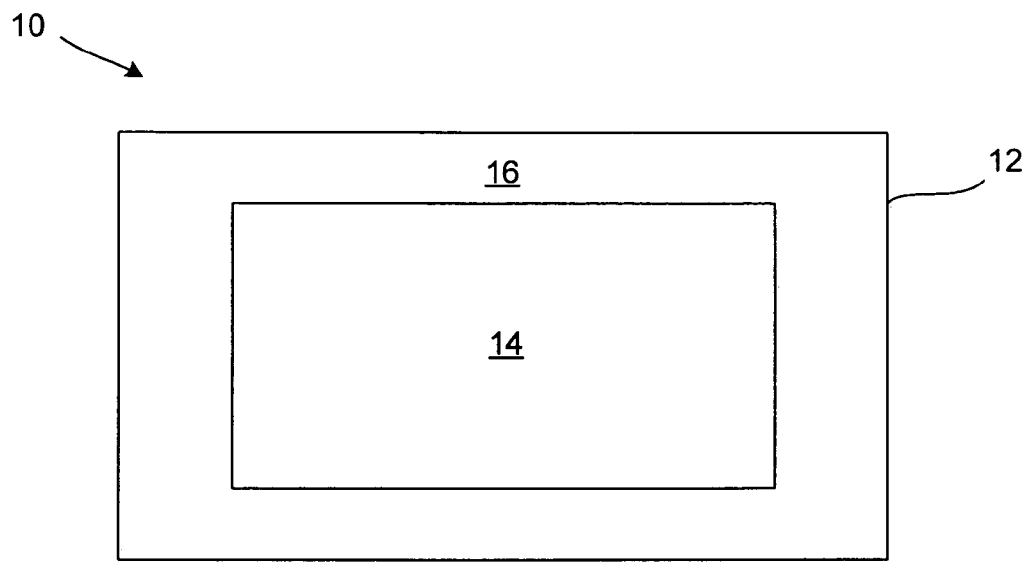
FIG. 1 is a schematic illustration of an exemplary memory device having a core region including an array of double-bit memory cells and a periphery region.

In the detailed description that follows, corresponding components have been given the same reference numerals regardless of whether they are shown in different embodiments of the present invention. To illustrate the present invention in a clear and concise manner, the drawings may not necessarily be to scale One embodiment of the present invention includes a method of forming a plurality of contact holes in a contact layer of an integrated circuit (IC) device, where the plurality of contact holes includes a plurality of densely-packed, regularly spaced contact holes having a first pitch along a first direction and a plurality of semi-isolated contact holes having a second pitch along a second direction. After providing a photoresist layer over the contact layer, the photoresist layer can be exposed to a double-dipole illumination source, which transmits light energy through a mask having a pattern corresponding to a desired contact hole pattern. The double-dipole illumination source can include a first dipole aperture oriented and optimized for patterning the densely-packed, regularly spaced contact holes and a second dipole aperture oriented approximately orthogonal to the first dipole aperture and optimized for patterning the plurality of semi-isolated contact holes.

The present invention will be described below in the exemplary context of a process for ultimately patterning a contact layer (e.g., an interlayer dielectric (ILD) layer) that forms a part of an IC device. Exemplary IC devices can include general use processors made from thousands or millions of transistors, a flash memory array or any other dedicated circuitry. However, one skilled in the art will appreciate that the methods and systems described herein can also be applied to the design process and/or manufacture of any article, which includes contact holes or other feature patterns of varying pitch and density and is manufactured using photolithography, such as micromachines, disk drive heads, gene chips, microelectro-mechanical systems (MEMS) and the like.

FIG. 1 schematically illustrates an exemplary IC device 10, such as a flash electrically erasable and programmable memory device, one or more contact layers of which can be fabricated or otherwise processed in accordance with the methodology described herein. The IC device 10 can be manufactured or otherwise formed on a semiconductor substrate 12 having a core region 14 and a periphery region 16. An exemplary flash memory device can include a core region containing one or more arrays of double-bit memory cells and a periphery region containing logic circuitry for controlling the memory cells within the core region. A typical array of double-bit memory cells in the core region can include, for example, 512 rows and 512 columns of double-bit memory cells.

Figure 2:
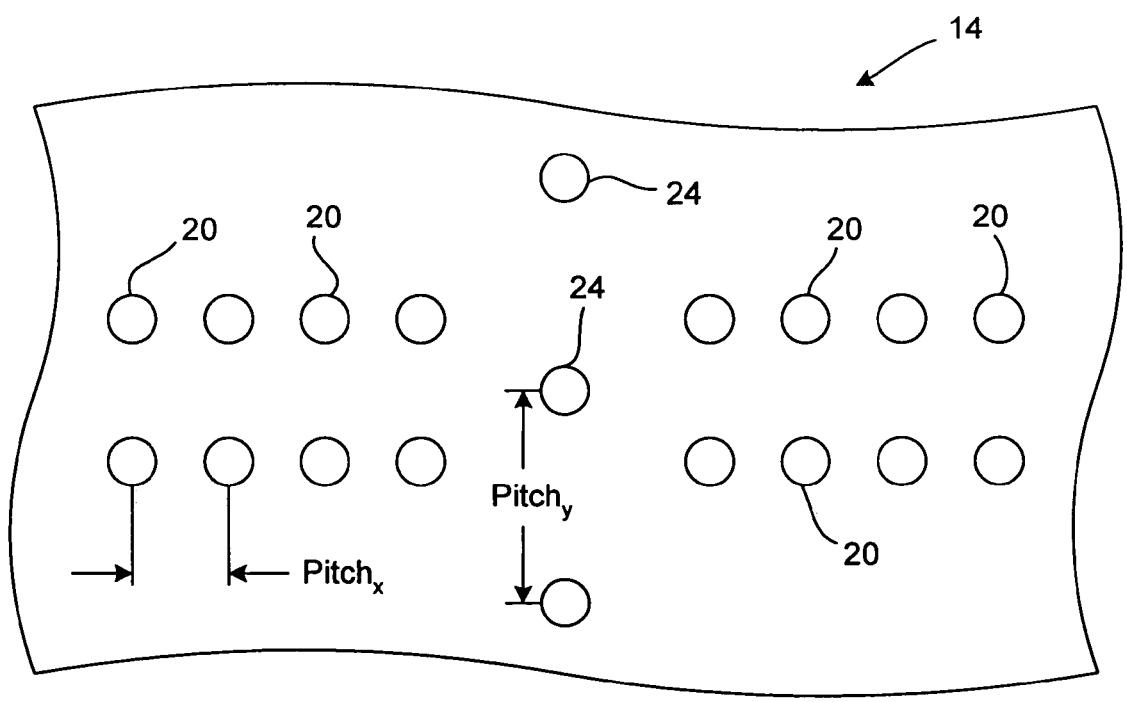
FIG. 2 is a schematic top view illustration of a portion of a contact layer in a core region which includes densely-packed contact holes and semi-isolated contact holes.

FIG. 2 is a schematic top view illustration of a portion of a contact layer (e.g., in a core region of a flash memory device), which exhibits a desired contact hole pattern including densely-packed, regularly spaced contact holes 20 and semi-isolated contact holes 24. In one embodiment, the desired contact hole pattern includes strings of contact holes (e.g., source/drain contact holes) on a minimum pitch along a first direction (e.g., the x-direction) as well as a plurality of semi-isolated contact holes 24 (e.g., $V_{ss}$ contact holes) on a second pitch along a second direction (e.g., the y-direction). As used herein, the term "densely-packed" contact holes can include a density, in terms of pitch, of about 130 nanometers (nm) to about 270 nm, while the term "semi-isolated" can include a density, in terms of pitch, of about 270 nm to about 500 nm. It is to be appreciated that the aforementioned pitch ranges span several technology nodes. For example, the 130 nm technology node can include densely-packed contact holes having pitches of about 380 nm to about 400 nm, while the 90 nm technology node can include densely-packed contact holes having pitches of about 240 nm. The 65 nm technology node can include densely-packed contact holes having pitches of about 150 nm to about 160 nm. Further, the low end of the densely-packed pitch range may extend to 120 nm or lower with a 193 nm light source. It is to be appreciated that light sources having shorter wavelengths (e.g., extreme ultraviolet or 157 nm) may benefit from the method and device described herein and enable further pitch reduction.

For purposes of this description, FIG. 2 illustrates strings of densely-packed contact holes on a pitch of $Pitch_x$ and semi-isolated contact holes on a pitch of $Pitch_y$. In one exemplary embodiment, the contact hole pattern illustrated in FIG. 2 can be thought of as corresponding to a contact hole pattern in a core region of a flash memory device in which strings of source/drain contacts are disposed on a minimum pitch in the x-direction and, for example, a pitch of twice the x-direction minimum pitch in the y-direction. In addition, every 8 bits or 16 bits or more, there is a semi-isolated $V_{ss}$ contact. In one embodiment, $Pitch_x$ can have a value of about 120 nm to about 260 nm, while $Pitch_y$ can have a value of about twice the y-cell pitch of a memory cell of about 150 nm to about 400 nm. As is discussed more fully below, such a contact hole pattern can be formed by creating and employing a double-dipole illumination source, including a pair of customized orthogonal dipole apertures, to expose a single mask having a desired contact hole pattern.

Figure 3:
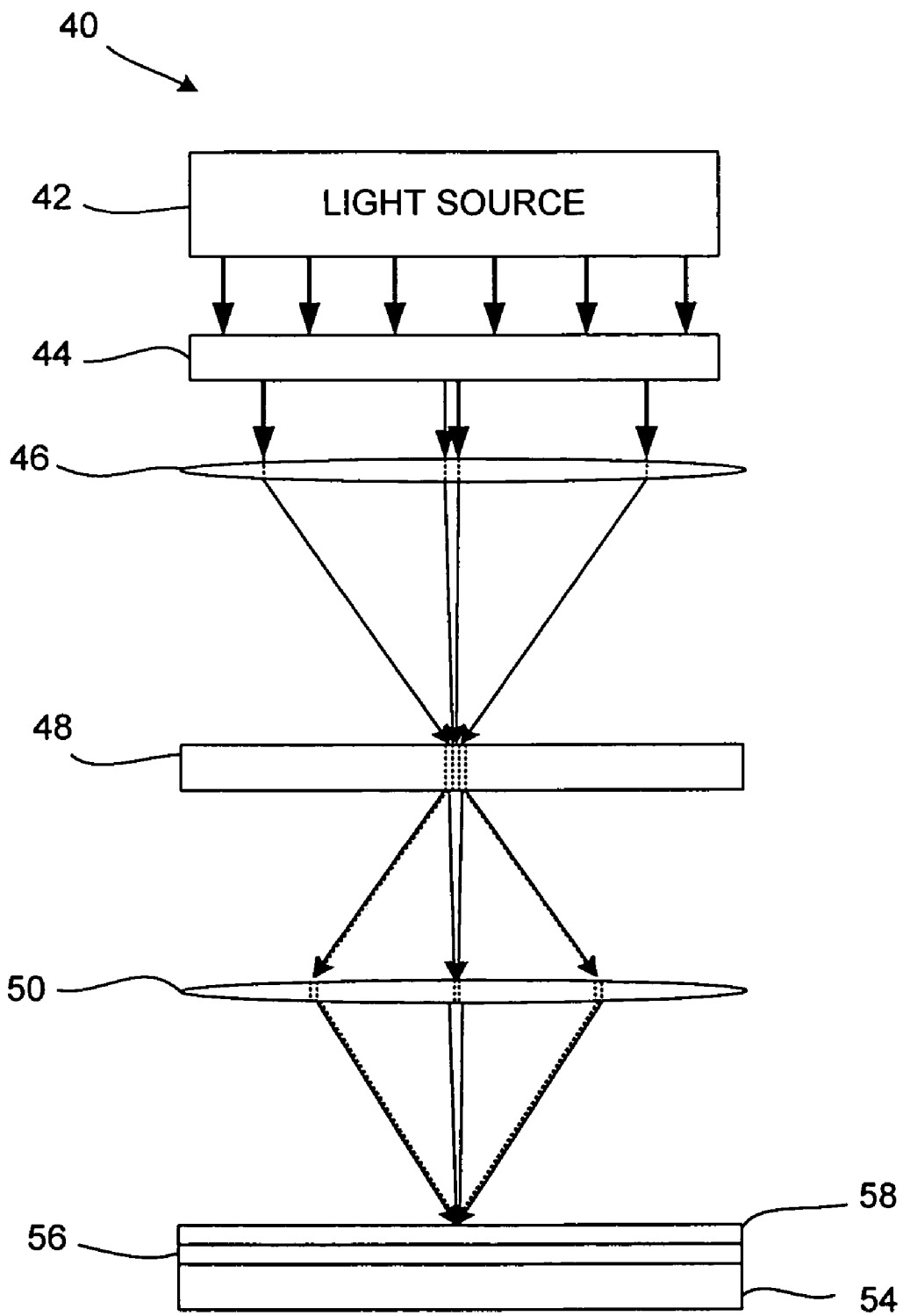
FIG. 3 is a schematic illustration of a photolithography apparatus in accordance with the present invention.

With reference now to FIG. 3, a photolithography apparatus 40 for patterning or otherwise processing a contact layer of an IC device to form a desired contact hole pattern therein is provided. The photolithography apparatus 40 can include a light source 42, which illuminates an aperture plate 44. The light source 42 can include any suitable light source, such as a source of partially coherent light having a wavelength of about 193 nanometers, which can be produced by an argon-fluoride laser. The light source can produce light having a wavelength in the ultraviolet (UV), vacuum ultraviolet (VUV), deep ultraviolet (DUV), or extreme ultraviolet (EUV) range. As is described more fully below, the aperture plate 44 can be a double-dipole aperture plate, which includes a pair of customized dipole apertures oriented substantially orthogonal to one another. Alternatively, another double-dipole generating means, such as a suitable diffractive optical element, can be employed.

Light passing through the aperture plate 44 can be condensed or otherwise focused by a lens system 46 onto a mask or reticle 48 having a desired contact hole pattern thereon. In one embodiment, the mask 48 can include a transmissive binary mask having a chrome pattern etched on a quartz substrate. However, it is to be appreciated that other masks, such as reflective masks, phase-shifting masks, attenuated or otherwise, and the like, can be employed without departing from the scope of the present invention. At least the $0^{th}$ and $1^{st}$ order diffraction components of the light passed by the mask 48 can be focused by a lens system 50 onto a target 52, such as a substrate or wafer 54 including a contact layer 56 coated with a photosensitive film, such as a photoresist 58.

Figure 4:
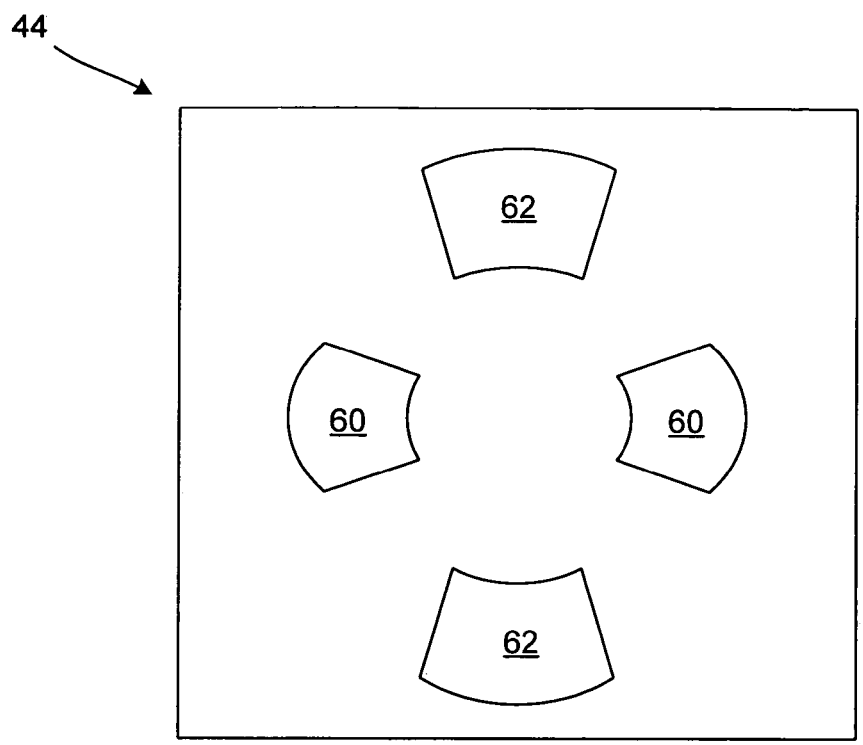
FIG. 4 is a schematic illustration of an exemplary double-dipole aperture plate in accordance with one embodiment of the present invention.

With reference to FIG. 4 and continued reference to FIG. 3, a double-dipole aperture plate 44 in accordance with one embodiment of the invention is provided. The aperture plate 44 can be made of a suitable opaque or electromagnetic radiation blocking material, such as aluminum, steel or any other suitable metal and can be of any suitable geometry, such as square, circular, rectangular and the like. Alternatively, the pupil shaping mechanism can include a diffractive optical element or include another optical element that enables shaping of the pupil. The aperture plate 44 can include or otherwise define a first dipole aperture 60 and a second dipole aperture 62. The first dipole aperture 60 can include a pair of openings or apertures oriented along a first axis (e.g., the x-axis). In addition, the aperture plate 44 can include or otherwise define a second dipole aperture or pair of openings 62 oriented along a second axis that is substantially orthogonal to the first axis (e.g., the y-axis). In one embodiment, the first dipole aperture 60 is different from the second dipole aperture 62 with respect to geometry, spacing, and/or size. Further, as is described more fully below, the first dipole aperture or dipole pair 60 is customized and/or optimized for printing the densely-packed contact holes having a pitch of $Pitch_x$. Similarly, the second dipole aperture or dipole pair 62 is customized and/or optimized for printing the semi-isolated contact holes having a pitch of $Pitch_y$.

Figure 5:
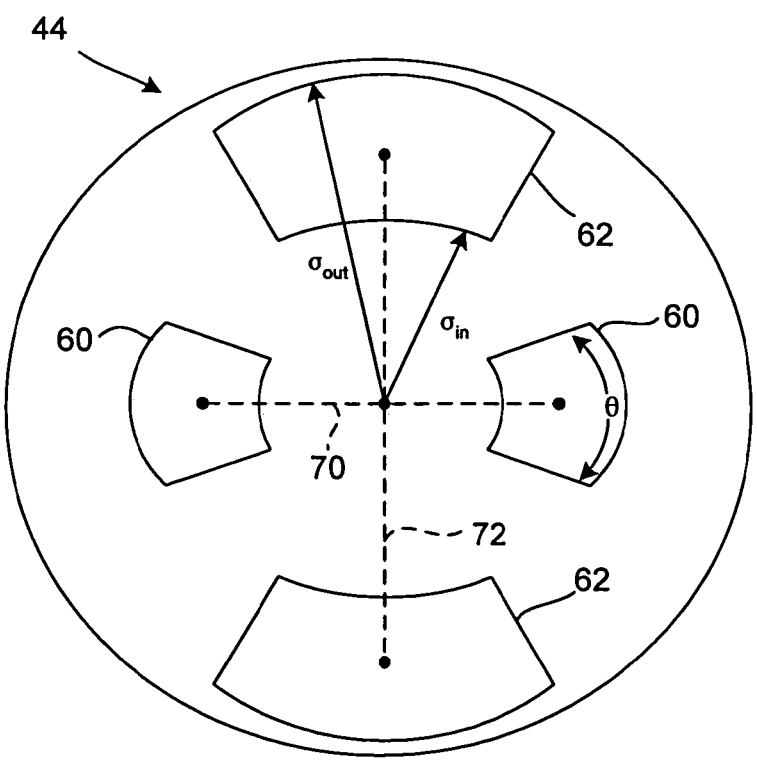
FIG. 5 is a schematic illustration of another exemplary double-dipole aperture plate in accordance with one embodiment of the present invention.

FIG. 5 illustrates another exemplary double-dipole aperture plate 44 in accordance with one embodiment of the present invention. The aperture plate 44 includes a first dipole aperture or dipole pair 60, which is oriented along the x-axis and a second dipole aperture or dipole pair 62, which is oriented along the y-axis. Alternatively, the first and second dipole pairs 60, 62 can be oriented along axes at some angle to the x- and y-axes that are substantially orthogonal to one another. In one embodiment, the first dipole pair 60 is customized and/or optimized for patterning the densely-packed contact holes having a pitch of $Pitch_x$. Customizing and/or optimizing the first dipole pair 60 can include optimizing the dipole pair with respect to size, shape and/or spacing so as to enhance resolution for the densely-packed contact holes.

In one embodiment, the spacing of the first dipole pair 60 is optimized or otherwise selected in accordance with $$Dipole_x = \frac{\lambda}{2NA \cdot Pitch_x},$$

where lambda ($\lambda$) is the wavelength of the light source being employed, NA is the numerical aperture associated with the photolithography apparatus, and $Pitch_x$ is the pitch of the densely-packed contact holes along the x-direction. $Dipole_x$ represents the spacing (dashed line 70) between the respective centers of the dipole pair 60.

Similarly, the spacing of the second dipole pair 62 is optimized or otherwise selected in accordance with $$Dipole_y = \frac{\lambda}{2NA \cdot Pitch_y},$$

where lambda ($\lambda$) is the wavelength of the light source being employed, NA is the numerical aperture associated with the photolithography apparatus, and $Pitch_y$ is the pitch of the semi-isolated contact holes along the y-direction. $Dipole_y$ represents the spacing (dashed line 72) between the respective centers of the dipole pair 62. The double-dipole aperture plate 44, including the first and second dipole pairs spaced according to two optimized solutions for $Dipole_x$ and $Dipole_y$, is used to illuminate a single mask having the desired contact hole pattern.

In additional to optimizing the spacing of the first dipole pair and the second dipole pair, other illumination and/or aperture parameters can be selected and/or optimized. In general, a dipole pair can be characterized using the following parameters: the orientation of the poles (e.g., horizontal, vertical or some angle relative thereto); inner radius, $\sigma_{in}$; outer radius, $\sigma_{out}$; and pole angle, $\theta$, (also referred to as wedge angle). These parameters are illustrated in FIG. 5.

In order to test the aforementioned illumination and/or aperture parameters, one or more simulation images can be generated using one of a variety of commercially available simulation tools, such as, for example, CALIBRE® from Mentor Graphics Corp. Each simulation image can correspond to a contact hole pattern that would be printed or otherwise formed on or in the contact layer if the contact layer was exposed to an illumination source (having a selected combination of illumination and/or aperture parameters) directed through a mask including the desired contact hole pattern. Alternatively, the simulation image can correspond to a simulation of a photoresist layer that would be patterned according to exposure to an illumination source (having selected illumination and/or aperture parameters) directed through a mask including the desired contact hole pattern. As such, the "real" contact hole pattern can be simulated for various combinations of illumination and/or aperture parameters as well as optical proximity corrections (OPC) and any other parameters that can alter the final contact hole pattern as compared to the desired contact hole pattern.

In order to determine the effectiveness of each set of illuminations and/or aperture parameters, each simulated image can be evaluated by applying one or more optical rule checking (ORC) checks. The ORC checks can be performed based on or more process-related parameters, also referred to as metrics. Contact hole pattern features that fall outside of an allowed range of one or more practice-related parameters may be indicative of a less than optimal set of illumination and/or aperture parameters.

Figure 6:
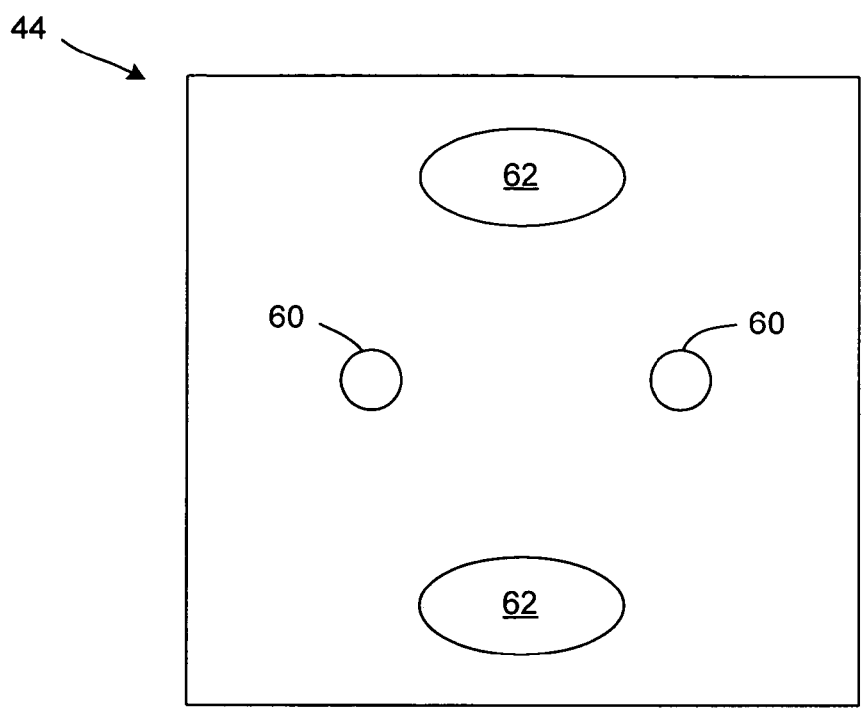
FIGS. 6 and 7 are schematic illustrations of exemplary double-dipole aperture plates in accordance alternative embodiments of the present invention.
Figure 7:
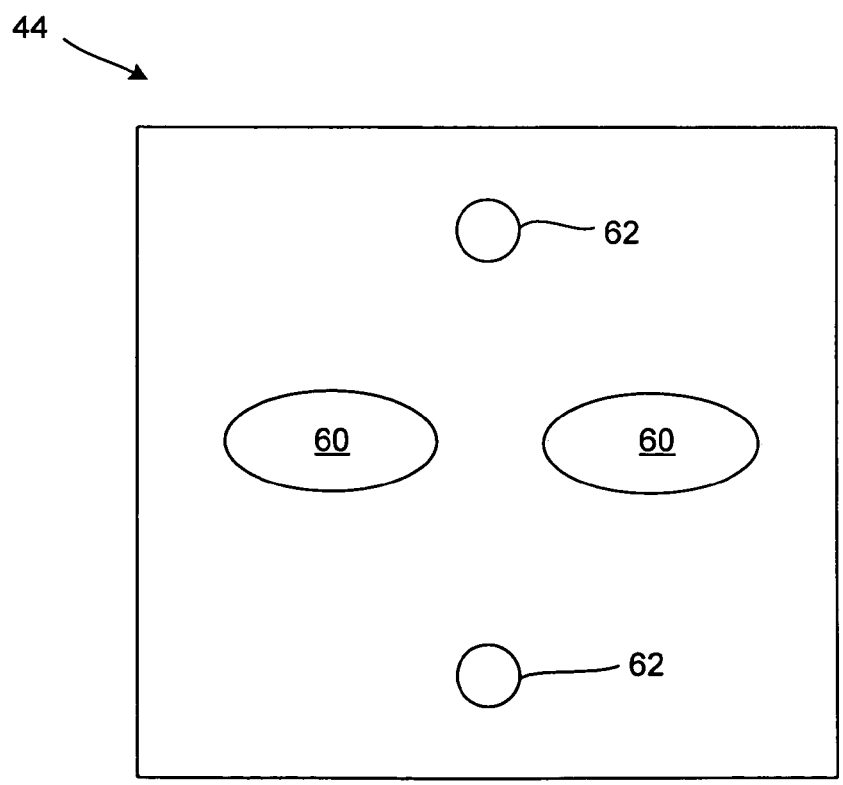

While FIGS. 4 and 5 illustrate dipole pairs made up of annular sectors, it is to be appreciated that other dipole pair geometries can be employed. For example, FIGS. 6 and 7 illustrate exemplary double-dipole aperture plates 44, which include different dipole pair geometries. FIG. 6 includes a first dipole pair 60 of substantially circular apertures or openings and a second dipole pair 62 of substantially elliptical apertures or openings. FIG. 7 includes a first dipole pair 60 of substantially elliptical apertures or openings and a second dipole pair 62 of substantially circular apertures or openings. Of course, the size and/or spacing of these dipole pairs can also be optimized and/or customized, in a manner described above, for printing densely-packed features, semi-isolated features or some combination of the two. Of course, dipole pairs of other geometries can be employed without departing from the scope of the invention.

Once the illumination source, including the customized double-dipole aperture plate is selected, a contact layer can be processed to form a desired contact hole pattern. This processing can be similar to that generally known and used by those of ordinary skill in the art. Therefore, the process will not be described in great detail.

A substrate, such as a semiconductor wafer, can include one or more layers of various materials. In one embodiment, the wafer can include a contact layer to be patterned with a desired contact hole pattern. A photoresist layer can be disposed over the contact layer. As one skilled in the art will appreciate, other materials and/or treatments can be disposed between the contact layer and the photoresist layer, including, for example, a primer, a bottom anti-reflective coating (BARC) layer, and so forth. The contact layer can be made from any suitable material, such as an insulator (e.g., silicon oxide or $SiO_2$, silicon nitride or $Si_3N_4$, etc). An appropriate photoresist layer, such as, a positive tone or negative tone photoresist layer, can be employed.

The photoresist layer can be exposed to customized double-dipole radiation, generated by the illumination source passing through the customized double-dipole aperture plate, passing through a mask containing a desired contact hole pattern. In one embodiment, the mask can include a transmissive binary mask, including an etched chrome pattern on quartz. However, it is to be appreciated that other masks can be employed. The exposed photoresist layer can be developed, optionally including a post exposure (PE) bake, in order to remove exposed or unexposed portions of the photoresist layer (depending upon whether a positive tone or negative tone photoresist is employed). Following development, the photoresist layer can include the desired contact hole pattern. Once the photoresist layer has been patterned with the desired contact hole pattern, the contact layer can be etched using a suitable wet etch or dry reactive ion etch (REI) to form contact hole openings corresponding to the desired contact hole pattern in the contact layer. Of course, further processing can include filling the contact hole openings with a suitable conductive material (e.g., a metal, a metal-containing compound or a semiconductor) to form a conductive via that vertically traverses the contact layer. The vias can be used to establish electrical connection between a layer disposed under the contact layer and a subsequently formed layer, components or interconnect disposed above the contact layer.

The above description is provided in connection with the exemplary context of patterning a core region of a contact layer to include densely-packed contact holes as well as semi-isolated contact holes by a single exposure of a mask using customized double-dipole illumination. Often, the fabrication of an IC device includes fabrication of features in the periphery area of the IC device. Typically, the desired contact hole pattern for the periphery region of the contact layer of an IC device includes a random arrangement of contact holes, which can range in density from a regular string of contact holes on a minimum pitch to fully isolated contact holes.

In one embodiment, a contact layer in the core region of the device can be patterned using a double-dipole illumination source, as is described above, to pass light through a single binary mask having a desired contact hole pattern. The periphery region of the contact layer can be patterned separately (i.e., with a different exposure) using a different illumination geometry and a different mask, having a different desired contact hole pattern. In one embodiment, a "low sigma" illumination source (i.e., an annular or dipole source in which the difference between $\sigma_{in}$ and $\sigma_{out}$ is relatively small) can be used in conjunction with an attenuated phase shift mask (PSM) having a transmission of about six percent. Alternatively, other illumination source-mask combinations can be employed in the separate patterning of the periphery region of the contact layer.

It should be noted that in interpreting the words "above", "over", and "on top of" in the specification and claims, these words are not intended to be restricted to directly above, directly over or directly on top of, but may include intervening layers between a layer described as being "above", "over", or "on top of" another layer or substrate. For example, the description of a first material above, over or on top of a substrate is not intended to exclude other layers being disposed therebetween.

Although particular embodiments of the invention have been described in detail, it is understood that the invention is not limited correspondingly in scope, but includes all changes, modifications and equivalents.

What is claimed is:

1. A method of forming a plurality of contact holes in a contact layer of an integrated circuit device, wherein the plurality of contact holes includes a plurality of regularly spaced contact holes having a first pitch along a first direction and a plurality of semi-isolated contact holes having a second pitch along a second direction, said method comprising:

providing a photoresist layer over the contact layer;

exposing the photoresist layer to a double-dipole illumination source which transmits light energy through a mask having a pattern corresponding to a desired contact hole pattern, the exposing resulting in the desired contact hole pattern being transferred to the photoresist layer;

wherein the double-dipole illumination source includes a first dipole aperture, said first dipole aperture being oriented and optimized for patterning the regularly spaced contact holes, and a second dipole aperture, said second dipole aperture being oriented substantially orthogonal to the first dipole aperture and optimized for patterning the plurality of semi-isolated contact holes, wherein the first dipole aperture and the second dipole aperture have at least one of (i) different sizes or (ii) different spacings; and etching the contact layer using the patterned photoresist layer.

2. The method as set forth in claim 1, wherein the first dipole aperture is oriented substantially vertically and the second dipole aperture is oriented substantially horizontally.

3. The method as set forth in claim 2, wherein the first dipole aperture is spaced according to:

$$Dipole_x = \frac{\lambda}{2NA \cdot Pitch_x},$$

where $Pitch_x$ is the first pitch; and the second dipole pair/aperture is spaced according to:

$$Dipole_y = \frac{\lambda}{2NA \cdot Pitch_y},$$

where $Pitch_y$ is the second pitch.

4. The method as set forth in claim 1, wherein the first pitch is smaller than the second pitch.

5. The method as set forth in claim 1, wherein the regularly spaced contact holes have a pitch of about 120 nm to about 270 nm.

6. The method as set forth in claim 5, wherein the regularly spaced contact holes have a diameter of about 120 to about 270 nm.

7. The method as set forth in claim 5, wherein the semi-isolated contact holes have a pitch of about 270 nm to about 500 nm.

8. A method of forming a plurality of contact holes in a contact layer of an integrated circuit device, wherein the plurality of contact holes includes a plurality of regularly spaced contact holes having a first pitch along a first direction and a plurality of semi-isolated contact holes having a second pitch along a second direction, said method comprising:

providing a photoresist layer over the contact layer;

exposing the photoresist layer to a double-dipole illumination source which transmits light energy through a mask having a pattern corresponding to a desired contact hole pattern, the exposing resulting in the desired contact hole pattern being transferred to the photoresist layer, wherein the exposing step includes a single exposure;

wherein the double-dipole illumination source includes a first dipole aperture, said first dipole aperture being oriented and optimized for patterning the regularly spaced contact holes, and a second dipole aperture, said second dipole aperture being oriented substantially orthogonal to the first dipole aperture and optimized for patterning the plurality of semi-isolated contact holes, wherein the first dipole aperture and the second dipole aperture have at least one of (i) different sizes or (ii) different spacings; and etching the contact layer using the patterned photoresist layer.

9. The method as set forth in claim 1, wherein the exposing step includes simultaneous illumination through the first and second dipole apertures.

10. The method as set forth in claim 1, wherein the mask is a binary mask.

11. The method as set forth in claim 1, wherein the double-dipole illumination source includes a light energy opaque substrate which defines a first pair of annular sector apertures and a second pair of annular sector apertures.

12. The method as set forth in claim 11, wherein the first pair of annular sector apertures and the second pair of annular sector apertures have at least one of (i) different sizes or (ii) different spacings.

13. The method as set forth in claim 1, wherein the plurality of contact holes includes a plurality of irregularly spaced contact holes in a periphery region, said method further comprising:

exposing the photoresist layer in the periphery region to a low sigma illumination source which provides light energy transmitted through a second mask having a pattern corresponding to a second desired contact hole pattern.

14. The method as set forth in claim 13, wherein the second mask is a six percent attenuated phase shift mask.

* * * * *